United States Patent [19]
Kim

[11] Patent Number: 5,834,974
[45] Date of Patent: Nov. 10, 1998

[54] DIFFERENTIAL AMPLIFIER WITH REDUCED CURRENT CONSUMPTION

[75] Inventor: Jung Pill Kim, Ichon, Rep. of Korea

[73] Assignee: Hyundai Electronics Industries Co., Ltd., Ichon, Rep. of Korea

[21] Appl. No.: 770,818

[22] Filed: Dec. 20, 1996

[30] Foreign Application Priority Data

Dec. 29, 1995 [KR] Rep. of Korea .................. 1995-66003

[51] Int. Cl.⁶ ........................................................ H03F 3/45
[52] U.S. Cl. .............................................. 330/253; 327/52
[58] Field of Search .................................... 330/253, 261; 327/52, 53, 54, 56

[56] References Cited

U.S. PATENT DOCUMENTS 5,039,881 8/1991 Ooms et al. .
5,309,039 5/1994 Ghassemi et al. .
5,557,221 9/1996 Taguchi et al. ............................ 327/53

Primary Examiner—James B. Mullins
Attorney, Agent, or Firm—Thelen Reid & Priest LLP

[57] ABSTRACT

A differential amplifier comprising a first NMOS transistor having its gate for receiving a first input signal, a second NMOS transistor having its gate for receiving a second input signal, a first PMOS transistor connected between the first NMOS transistor and a supply voltage source, a second PMOS transistor connected between the second NMOS transistor and the supply voltage source and having its gate connected to a gate of the first PMOS transistor through a first common node, and a current source circuit connected between a second common node of the first and second NMOS transistors and a ground voltage source, the current source circuit including a third NMOS transistor having its gate for receiving an enable signal and a fourth NMOS transistor connected in series to the third NMOS transistor and having its gate for receiving the first or second input signal. According to the present invention, current consumption amount is reduced in a standby mode where no input signal is applied.

7 Claims, 3 Drawing Sheets

DIFFERENTIAL AMPLIFIER WITH REDUCED CURRENT CONSUMPTION

BACKGROUND OF THE INVENTION

1. Field of the Invention

The present invention relates in general to differential amplifiers, and more particularly to a differential amplifier with a reduced current consumption amount.

2. Description of the Prior Art

Generally, a differential amplifier is adapted to receive two input signals and amplify a difference between the received two input signals.

FIGS. 1A, 1B and 1C, collectively referred to as FIG. 1, show conventional differential amplifiers.

FIG. 1A is a circuit diagram illustrating the construction of a differential amplifier of the NMOS type. As shown in this drawing, the differential amplifier of the NMOS type comprises a PMOS transistor MP1 connected between a supply voltage source Vcc and a node N1 and having its gate connected to the node N1, and a PMOS transistor MP2 connected between the supply voltage source Vcc and a node N2 and having its gate connected to the node N1. The PMOS transistors MP1 and MP2 constitute a current mirror.

The differential amplifier of the NMOS type further comprises an NMOS transistor MN1 connected between the node N1 and a node N3 and having its gate for receiving a reference voltage Vref, an NMOS transistor MN2 connected between the nodes N2 and N3 and having its gate for receiving an input signal in1, and an NMOS transistor MN3 connected between the node N3 and a ground voltage source Vss and having its gate for receiving an enable signal en.

In operation, if the input signal in1 is higher in level than the reference voltage Vref under the condition that the PMOS transistors MP1 and MP2 and the NMOS transistors MN1 and MN2 are the same in the channel length and width, and the enable signal en is high in logic, current flowing to the NMOS transistor MN2 is larger than that flowing to the NMOS transistor MN1. As a result, a signal at an output terminal out1 becomes low in logic. In contrast, in the case where the input signal in1 is lower in level than the reference voltage Vref, the current flowing to the NMOS transistor MN1 is larger than that flowing to the NMOS transistor MN2, thereby causing the signal at the output terminal out1 to become high in logic.

Fig. 1B is a circuit diagram illustrating the construction of a differential amplifier of the PMOS type. As shown in this drawing, the differential amplifier of the PMOS type comprises a PMOS transistor MP3 connected between the supply voltage source Vcc and a node N4 and having its gate for receiving an enable signal enb, a PMOS transistor connected between the node N4 and a node N5 and having its gate for receiving the reference voltage Vref, a PMOS transistor MP5 connected between the node N4 and a node N6 and having its gate for receiving an input signal in2, an NMOS transistor MN4 connected between the node N5 and the ground voltage source Vss and having its gate connected to the node N5, and an NMOS transistor MN5 connected between the node N6 and the ground voltage source Vss and having its gate connected to the node N5. The NMOS transistors MN4 and MN5 constitute a current mirror.

In operation, if the input signal in2 is lower in level than the reference voltage Vref under the condition that the PMOS transistors MP4 and MP5 and the NMOS transistors MN4 and MN5 are the same in their channel lengths and widths and the enable signal enb is low in logic, current flowing to the PMOS transistor MP5 is larger than that flowing to the PMOS transistor MP4. As a result, a signal at an output terminal out2 becomes high in logic. In contrarst, if the input signal in2 is higher in level than the reference voltage Vref, the current flowing to the PMOS transistor MP4 is larger in amount than that flowing to the PMOS transistor MP5, thereby causing the signal at the output terminal out2 to become low in logic.

Recently, many semiconductor memory devices requiring a high operation speed, such as DRAMs, more particularly SDRAMs have been developed, and the differential amplifier is often used as an input buffer of such a semiconductor memory device. However, as shown in FIGS. 1A and 1B, if the enable signals en and enb are enabled high and low in logic, respectively, constant amounts of current flow through the NMOS and PMOS transistors MN1 and MP4 regardless of the voltage levels of the input signals in1 and in2, respectively, because the reference voltage Vref is about 1.4 V. As a result, unnecessary power consumption is caused in a standby mode where no input signal is applied.

FIG. 1C is a waveform diagram of the input signals in1 and in2 in FIGS. 1A and 1B. Current is always consumed irrespective of whether the input signals in1 and in2 are at a state T1 (high level) or T2 (low level).

In other words, in the case where the differential amplifier is used as an input buffer of an SDRAM, the reference voltage input element is always turned on regardless of the voltage level of the input signal, resulting in much current being consumed.

SUMMARY OF THE INVENTION

Therefore, the present invention has been made in view of the above problem, and it is an object of the present invention to provide a differential amplifier in which a switching element is provided at a pull-up driver stage or a pull-down driver stage of the differential amplifier, for performing a switching operation in response to an input signal to reduce the amount of current consumption in a standby mode where no input signal is applied.

In accordance with one aspect of the present invention, a differential amplifier is comprised of first transistor means having its gate for receiving a first input signal; second transistor means having its gate for receiving a second input signal; third transistor means connected between the first transistor means and a first voltage source; fourth transistor means connected between the second transistor means and the first voltage source and having its gate connected to a gate of the third transistor means through a first common node; and current source means connected between a second common node of the first and second transistor means and a second voltage source, the current source means including fifth transistor means having its gate for receiving an enable signal and sixth transistor means connected in series to the fifth transistor means and having its gate for receiving the first or second input signal.

In accordance with another aspect of the present invention, a differential amplifier is comprised of first transistor means having its gate for receiving a first input signal; second transistor means having its gate for receiving a second input signal; third transistor means connected between the first transistor means and a first voltage source; fourth transistor means connected between the second transistor means and the first voltage source and having its gate connected to a gate of the third transistor means through a first common node; and current source means connected between a second common node of the first and second transistor means and a second voltage source, the current source means including fifth to seventh transistor means connected in series, the fifth transistor means having its gate for receiving an enable signal, the sixth transistor means having its gate for receiving the first input signal, the seventh transistor means having its gate for receiving the second input signal.

BRIEF DESCRIPTION OF THE DRAWINGS

The above and other objects, features and advantages of the present invention will be more clearly understood from the following detailed description taken in conjunction with the accompanying drawings, in which:

FIG. 1 shows conventional differential amplifiers, wherein:

FIG. 2, made up of FIGS. 2A, 2B and 2C show differential amplifiers in accordance with an embodiment of the present invention, wherein:

FIG. 3, made up of FIGS. 3A, 3B and 3C show differential amplifiers in accordance with an alternative embodiment of the present invention, wherein:

DETAILED DESCRIPTION OF THE PREFERRED EMBODIMENTS

Figure 1A:
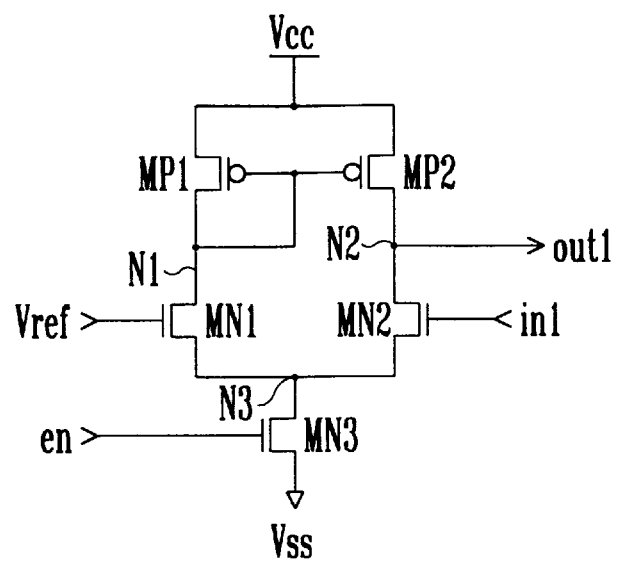
FIG. 1A is a circuit diagram illustrating the construction of a differential amplifier of the NMOS type.
Figure 1B:
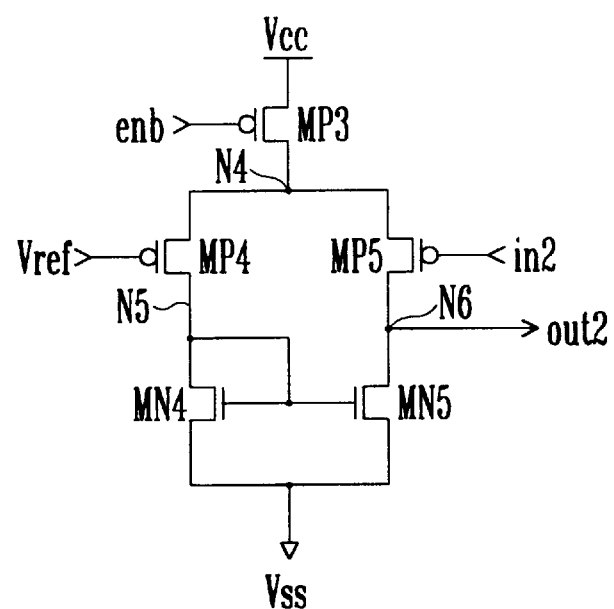
FIG. 1B is a circuit diagram illustrating the construction of a differential amplifier of the PMOS type.
Figure 1C:
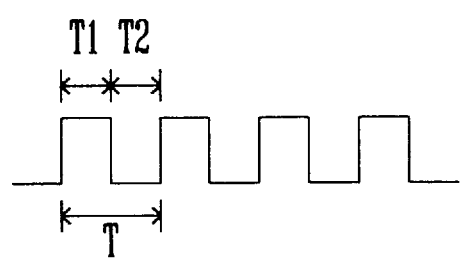
FIG. 1C is a waveform diagram of input signals in FIGS. 1A and 1B.
Figure 2A:
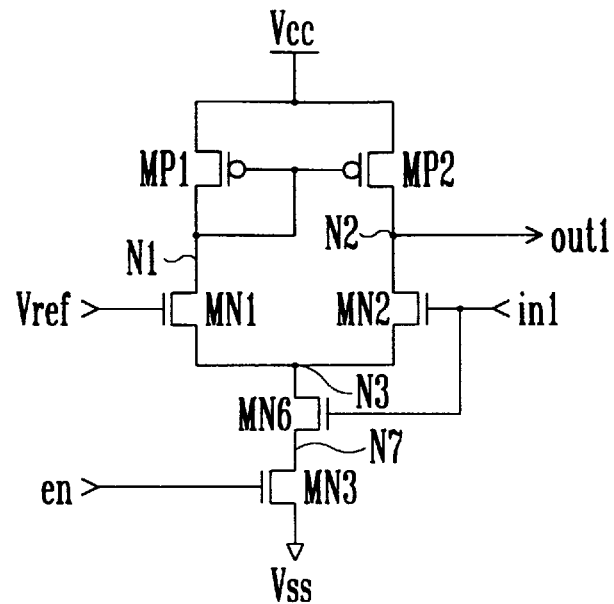
FIG. 2A is a circuit diagram illustrating the construction of a differential amplifier of the NMOS type.
Figure 2B:
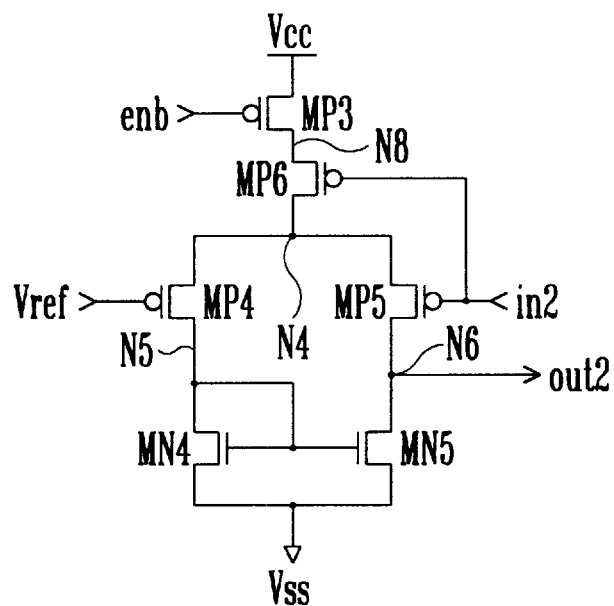
FIG. 2B is a circuit diagram illustrating the construction of a differential amplifier of the PMOS type.
Figure 2C:
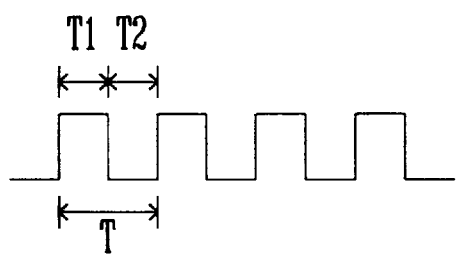
FIG. 2C is a waveform diagram of input signals in FIGS. 2A and 2B.

FIG. 2 shows differential amplifiers in accordance with an embodiment of the present invention, wherein FIG. 2A is a circuit diagram illustrating the construction of a differential amplifier of the NMOS type. FIG. 2B is a circuit diagram illustrating the construction of a differential amplifier of the PMOS type. FIG. 2C is a waveform diagram of input signals in FIGS. 2A and 2B.

As shown in FIG. 2A, the differential amplifier of the NMOS type comprises a PMOS transistor MP1 connected between a supply voltage source Vcc and a node N1 and having its gate connected to the node N1, and a PMOS transistor MP2 connected between the supply voltage source Vcc and a node N2 and having its gate connected to the node N1. The PMOS transistors MP1 and MP2 constitute a current mirror.

The differential amplifier of the NMOS type further comprises an NMOS transistor MN1 connected between the node N1 and a node N3 and having its gate for receiving a reference voltage Vref, an NMOS transistor MN2 connected between the nodes N2 and N3 and having its gate for receiving an input signal in1, an NMOS transistor MN6 connected between the node N3 and a node N7 and having its gate for receiving the input signal in1, and an NMOS transistor MN3 connected between the node N7 and a ground voltage source Vss and having its gate for receiving an enable signal en.

In operation, assume that the input signal in1 has a voltage level of "H=3 V" in an interval T1 in FIG. 2C and a voltage level of "L=0V" in an interval T2 in FIG. 2C. In most of SDRAMs, the input signal in1 may be regarded as a clock signal and the entire operation is performed at a rising edge of the clock signal. In other words, if the input signal in1 is enabled high in logic (interval T1), the NMOS transistor MN6 is turned on to operate the chip. However, in the case where the input signal in1 goes low in logic (interval T2), the NMOS transistor MN6 is turned off to reduce the current consumption.

In FIG. 2B, the differential amplifier of the PMOS type comprises a PMOS transistor MP3 connected between the supply voltage source Vcc and a node N8 and having its gate for receiving an enable signal enb, a PMOS transistor MP6 connected between the node N8 and a node N4 and having its gate for receiving an input signal in2, a PMOS transistor MP4 connected between the node N4 and a node N5 and having its gate for receiving the reference voltage Vref, a PMOS transistor MP5 connected between the node N4 and a node N6 and having its gate for receiving the input signal in2, an NMOS transistor MN4 connected between the node N5 and the ground voltage source Vss and having its gate connected to the node N5, and an NMOS transistor MN5 connected between the node N6 and the ground voltage source Vss and having its gate connected to the node N5. The NMOS transistors MN4 and MN5 constitute a current mirror.

In most of SDRAMs, the input signal in2 may be regarded as a row address strobe bar signal RASb and the entire operation is performed at a falling edge of the row address strobe bar signal RASb. As a result, if the input signal in2 is enabled low in logic (interval T2 in FIG. 2C), the PMOS transistor MP6 is turned on to operate the chip. However, in the case where the input signal in2 goes high in logic (interval T1 in FIG. 2C), the PMOS transistor MP6 is turned off to reduce the current consumption.

Figure 3A:
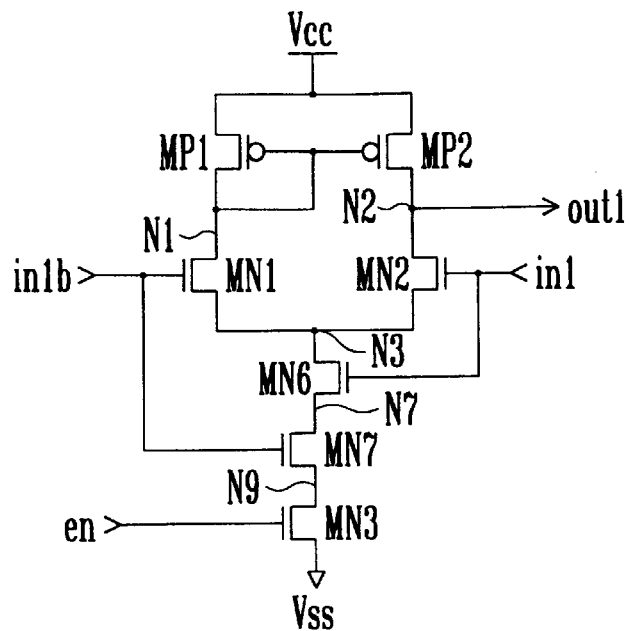
FIG. 3A is a circuit diagram illustrating the construction of a differential amplifier of the NMOS type.
Figure 3B:
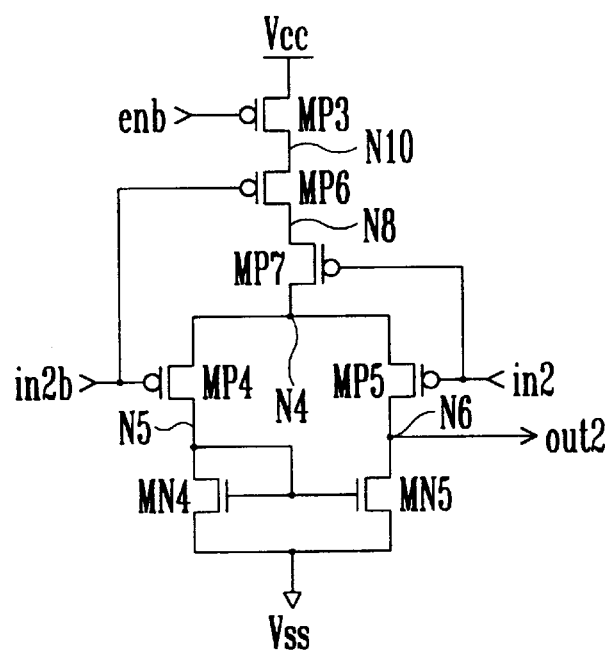
FIG. 3B is a circuit diagram illustrating the construction of a differential amplifier of the PMOS type.
Figure 3C:
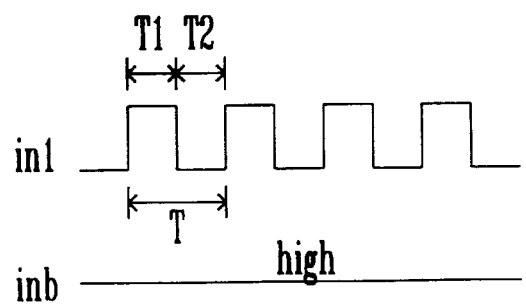
FIG. 3C is a waveform diagram of input signals in FIGS. 3A and 3B.

FIG. 3 shows differential amplifiers in accordance with an alternative embodiment of the present invention, wherein FIG. 3A is a circuit diagram illustrating the construction of a differential amplifier of the NMOS type, FIG. 3B is a circuit diagram illustrating the construction of a differential amplifier of the PMOS type and FIG. 3C is a waveform diagram of input signals in FIGS. 3A and 3B. Noticeably, the second embodiment of FIG. 3 employs two input signals, whereas the first embodiment of FIG. 2 employs one input signal and one constant reference voltage of about 1.4 V.

As shown in FIG. 3A, the differential amplifier of the NMOS type comprises a PMOS transistor MP1 connected between a supply voltage source Vcc and a node N1 and having its gate connected to the node N1, and a PMOS transistor MP2 connected between the supply voltage source Vcc and a node N2 and having its gate connected to the node N1. The PMOS transistors MP1 and MP2 constitute a current mirror.

The differential amplifier of the NMOS type further comprises an NMOS transistor MN1 connected between the node N1 and a node N3 and having its gate for receiving an input signal in1b, an NMOS transistor MN2 connected between the nodes N2 and N3 and having its gate for receiving an input signal in1, an NMOS transistor MN6 connected between the node N3 and a node N7 and having its gate for receiving the input signal in1, an NMOS transistor MN7 connected between the node N7 and a node N9 and having its gate for receiving the input signal in1b, and an NMOS transistor MN3 connected between the node N9 and a ground voltage source Vss and having its gate for receiving an enable signal en.

In operation, in the case where the input signal in1 goes from high to low in logic under the condition that the input signal in1b is high in logic, the differential amplifier performs a sense amplification operation while the input signal in1 makes the high to low transition in logic. Then, when the input signal in1 is maintained at its low logic state, the NMOS transistor MN6 is turned off to reduce the current consumption.

In FIG. 3B, the differential amplifier of the PMOS type comprises a PMOS transistor MP3 connected between the supply voltage source Vcc and a node N10 and having its gate for receiving an enable signal enb, a PMOS transistor MP6 connected between the node N10 and a node N8 and having its gate for receiving an input signal in2b, a PMOS transistor MP7 connected between the node N8 and a node N4 and having its gate for receiving an input signal in2, a PMOS transistor MP4 connected between the node N4 and a node N5 and having its gate for receiving the input signal in2b, a PMOS transistor MP5 connected between the node N4 and a node N6 and having its gate for receiving the input signal in2, an NMOS transistor MN4 connected between the node N5 and the ground voltage source Vss and having its gate connected to the node N5, and an NMOS transistor MN5 connected between the node N6 and the ground voltage source Vss and having its gate connected to the node N5. The NMOS transistors MN4 and MN5 constitute a current mirror.

In operation, in the case where the input signal in2 goes from low to high in logic under the condition that the input signal in2b is low in logic, the differential amplifier performs a sense amplification operation while the input signal in2 makes the low to high transition in logic. Then, when the input signal in2 is maintained at its high low state, the PMOS transistor MP7 is turned off to reduce the current consumption.

In general, time is required to a certain degree in sensing and amplifying a difference between the input signals in the differential amplifier. For this reason, for example, in FIG. 3A, delay circuits may be used to delay the input signal in1 to the gate of the NMOS transistor MN6 and the input signal in1b to the gate of the NMOS transistor MN7, respectively. Similarly, in FIG. 3B, delay circuits may be used to delay the input signal in2 to the gate of the PMOS transistor MP6 and the input signal in2b to the gate of the PMOS transistor MP7, respectively. Such a delay circuit may be provided with a resistor and a capacitor. Alternatively, the delay circuit may be provided with a transistor. The use of a delay circuit allows the differential amplifier to smoothly perform the sense amplification operation.

As is apparent from the above description, according to the present invention, the switching element is provided at the pull-up driver stage or the pull-down driver stage of the differential amplifier to perform the switching operation in response to the input signal. Therefore, the current consumption is reduced in a standby mode where no input signal is applied.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A differential amplifier comprising:

first transistor means having its gate for receiving a first input signal;

second transistor means having its gate for receiving a second input signal;

third transistor means connected between said first transistor means and a first voltage source;

fourth transistor means connected between said second transistor means and said first voltage source and having its gate connected to a gate of said third transistor means through a first common node; and current source means connected between a second common node of said first and second transistor means and a second voltage source, said current source means including fifth to seventh transistor means connected in series, said fifth transistor means having its gate for receiving an enable signal, said sixth transistor means having its gate for receiving said first input signal, said seventh transistor means having its gate for receiving said second input signal.

2. A differential amplifier as set forth in claim 1, wherein said first voltage source is a supply voltage source and said second voltage source is a ground voltage source.

3. A differential amplifier as set forth in claim 2, wherein said first and second transistor means and said fifth to seventh transistor means are NMOS transistors and said third and fourth transistor means are PMOS transistors for constituting current mirror means.

4. A differential amplifier as set forth in claim 3, wherein said first and second input signals have variable voltage levels.

5. A differential amplifier as set forth in claim 1, wherein said first voltage source is a ground voltage source and said second voltage source is a supply voltage source.

6. A differential amplifier as set forth in claim 5, wherein said first and second transistor means and said fifth to seventh transistor means are PMOS transistors and said third and fourth transistor means are NMOS transistors for constituting current mirror means.

7. A differential amplifier as set forth in claim 6, wherein said first and second input signals have variable voltage levels.

* * * * *